United States Patent
Wang et al.

(10) Patent No.: US 10,192,939 B2
(45) Date of Patent: Jan. 29, 2019

(54) DISPLAY DEVICE AND FABRICATION METHOD THEREOF

(71) Applicant: BOE TECHNOLOGY GROUP CO., LTD, Beijing (CN)

(72) Inventors: Yulin Wang, Beijing (CN); Chun Jan Wang, Beijing (CN)

(73) Assignee: BOE TECHNOLOGY GROUP CO., LTD, Beijing (CN)

( * ) Notice: Subject to any disclaimer, the term of this patent is extended or adjusted under 35 U.S.C. 154(b) by 0 days.

(21) Appl. No.: 15/325,097

(22) PCT Filed: Oct. 29, 2015

(86) PCT No.: PCT/CN2015/093192
§ 371 (c)(1),
(2) Date: Jan. 10, 2017

(87) PCT Pub. No.: WO2017/070889
PCT Pub. Date: May 4, 2017

(65) Prior Publication Data
US 2017/0301736 A1    Oct. 19, 2017

(51) Int. Cl.
*G06F 3/00* (2006.01)
*H01L 27/32* (2006.01)
(Continued)

(52) U.S. Cl.
CPC .......... *H01L 27/323* (2013.01); *G06F 3/0412* (2013.01); *H01L 51/0097* (2013.01);
(Continued)

(58) Field of Classification Search
CPC . G06F 3/0412; H01L 27/323; H01L 51/0097; H01L 51/5253; H01L 51/5281
See application file for complete search history.

(56) References Cited

U.S. PATENT DOCUMENTS

2009/0072230 A1* 3/2009 Ito .................. H01L 51/5253
257/40
2009/0161042 A1* 6/2009 Inoue ............... G02F 1/134363
349/96
(Continued)

FOREIGN PATENT DOCUMENTS

CN    101846829 A    9/2010
CN    103682154 A    3/2014
(Continued)

OTHER PUBLICATIONS

The World Intellectual Property Organization (WIPO) International Search Report for PCT/CN2015/093192 dated Aug. 8, 2016 p. 1-14.
(Continued)

Primary Examiner — Kevin M Nguyen
(74) Attorney, Agent, or Firm — Anova Law Group, PLLC

(57) ABSTRACT

A display device and fabrication method thereof are provided. The display device includes an encapsulation film encapsulating a thin film transistor array and a pixel array on a base substrate; a protection film on the encapsulation film and including a first retardation film; a touch film on the protection film and including a second retardation film; and a polarizer film on the touch film.

19 Claims, 2 Drawing Sheets

(51) Int. Cl.
*G06F 3/041* (2006.01)
*H01L 51/00* (2006.01)
*H01L 51/52* (2006.01)

(52) U.S. Cl.
CPC ...... *H01L 51/5253* (2013.01); *H01L 51/5281* (2013.01); *G06F 2203/04102* (2013.01); *G06F 2203/04103* (2013.01); *H01L 27/3244* (2013.01); *H01L 2251/5338* (2013.01)

(56) References Cited

U.S. PATENT DOCUMENTS

| | | | | |
|---|---|---|---|---|
| 2010/0134448 | A1* | 6/2010 | Park | G02F 1/13338 345/176 |
| 2013/0335344 | A1* | 12/2013 | Han | C09J 133/066 345/173 |
| 2014/0231767 | A1* | 8/2014 | Tsai | H01L 51/5259 257/40 |
| 2014/0265822 | A1* | 9/2014 | Drzaic | H01L 51/5281 313/504 |
| 2015/0144909 | A1* | 5/2015 | Byun | H01L 51/5253 257/40 |
| 2015/0169094 | A1* | 6/2015 | Liu | H01L 51/5262 345/173 |
| 2016/0137769 | A1* | 5/2016 | Kwack | C07C 69/54 257/40 |
| 2016/0254487 | A1* | 9/2016 | Harikrishna Mohan | H01L 51/5253 428/213 |

FOREIGN PATENT DOCUMENTS

| | | |
|---|---|---|
| CN | 104659051 A | 5/2015 |
| TW | M489328 U | 11/2014 |

OTHER PUBLICATIONS

State Intellectual Property Office of the P.R.O (SIPO) Office Action 1 for 201580002627.3 dated Jul. 3, 2018 14 Pages. (including translation).

* cited by examiner

DISPLAY DEVICE AND FABRICATION METHOD THEREOF

This application is a national phase entry under 35 U.S.C. § 371 of International Application No. PCT/CN2015/093192, filed on Oct. 29, 2015, the entire content of which is incorporated by reference herein.

FIELD OF THE DISCLOSURE

The present disclosure generally relates to the field of the display technologies and, more particularly, relates to display devices and manufacturing methods thereof.

BACKGROUND

In the photoelectric display technology, an organic light emitting diode (OLED) is a self-luminous device, with high brightness and high contrast. In addition, an OLED device may be an ultra-thin and flexible device, having low power consumption and wide operating temperature range.

Circular polarizer is used to effectively prevent effects of reflection of ambient light on OLED display devices. A circular polarizer includes a polarizer film and a retardation film. The retardation film may be a quarter-wave plate. The ambient light, after passing through the polarizing layer and the quarter-wave plate, may become a circularly polarized light. After reflected, the circularly polarized light passes through the quarter-wave plate and becomes linearly polarized light perpendicular to a direction of the transmission axis of the polarizing layer. The linearly polarized light may be blocked within the polarizer, thus eliminating effect of ambient light on the emitted light from the OLED display device.

Touch input via a touch screen may be fast responded, space-saving, and easy to communicate with human. It is desirable to integrate a touch screen with OLED display devices. However, when the barrier film and circular polarizer of the OLEO device are integrated with touch screen, the resultant, integrated device may be too thick and less light. In addition, this too-thick device may adversely affect bending and folding properties of flexible devices.

The disclosed display device and fabrication method thereof may at least partially alleviate one or more problems set forth above and other problems in the art.

BRIEF SUMMARY OF THE DISCLOSURE

One aspect of the present disclosure includes a display device. The display device includes an encapsulation film encapsulating a thin film transistor array and a pixel array on a base substrate; a protection film over the encapsulation film and including a first retardation film; a touch film on the protection film and including a second retardation film; and a polarizer film on the touch film.

Optionally, each of the first and second retardation films includes a $\frac{1}{8}\lambda$ retardation film.

Optionally, the touch film further includes an X-conductive coating and a Y-conductive coating, and the second retardation film is sandwiched between the X-conductive coating and Y-conductive coating. Optionally, the X-conductive coating is an X-electrode of the touch film, and the Y-conductive coating is a Y-electrode of the touch film.

Optionally, the protection film further includes a water-oxygen-barrier layer laminated with the first retardation film. Optionally, the water-oxygen-barrier layer is formed of one or more materials selected from a group of alumina, titania, zirconia, oxide nitride, silicon nitride, and silicon carbonitride.

Optionally, the first or second retardation film includes a polymer wave plate.

Optionally, the encapsulation film includes one or more elements selected from a group of an inorganic structure film, an inorganic-organic composite material thin film, an inorganic-organic thin-film stack, and a laminated structure of an inorganic-organic composite material thin film and an organic thin film.

Optionally, the encapsulation film contains one or more inorganic materials selected from a group of alumina, titania, zirconia, silicon oxide, silicon nitride, and silicon carbonitride.

Optionally, the encapsulation film contains one or more organic materials selected from a group of poly (methyl methacrylate) and hexamethyl silyl ether.

Optionally, the encapsulation film contains an inorganic-organic composite material including a mixture of silica and a long-chain silicon-carbon compound.

Optionally, the encapsulation film has a thickness ranging from about 1 μm to about 20 μm.

Optionally, the polarizer film is made of a polymer including polyvinyl alcohol (PVA).

Optionally, the base substrate includes a flexible substrate on a barrier film. The flexible substrate has a thickness ranging from about 5 μm to about 20 μm, and the barrier film has a thickness ranging from about 50 μm to about 100 μm.

Optionally, an adhesive layer is between the encapsulation film and the protection film, between the protection film and the touch film, and between the touch film and the polarizer film. The adhesive layer is made of at least one of an optical clear adhesive (OCA) and a pressure sensitive adhesive (PSA).

Another aspect of the present disclosure includes a method for forming a display device. A protection film is provided over a base substrate, the protection film including a first retardation film. A touch film is formed on the protection film, the touch film including a second retardation film. A polarizer film is formed on the touch film.

Optionally, each of the first and second retardation films includes a $\frac{1}{8}\lambda$ retardation film.

Optionally, the touch film further includes an X-conductive coating and a Y-conductive coating, and the second retardation film is sandwiched between the X-conductive coating and Y-conductive coating. The X-conductive coating is an X-electrode of the touch film and the Y-conductive coating is a Y-electrode of the touch film.

Optionally, the protection film further includes a water-oxygen-barrier layer laminated with the first retardation film. The water-oxygen-barrier layer is formed of one or more materials selected from a group of alumina, titania, zirconia, oxide nitride, silicon nitride, and silicon carbonitride.

Optionally, a thin film transistor array and a pixel array are formed on the base substrate. An encapsulation film encapsulating the thin film transistor array and the pixel array is funned on the base substrate. The protection film is formed on the encapsulation film.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

For those skilled in the art to better understand the technical solution of the disclosure, reference will now be made in detail to exemplary embodiments of the disclosure, which are illustrated in the accompanying drawings. Wherever possible, the same reference numbers will be used throughout the drawings to refer to the same or like parts.

Various embodiments provide a display device, such as a flexible OLED display device, and fabrication method thereof. In the disclosed display device, various functional films/layers may be effectively integrated into a single device to reduce thickness and weight of the resultant display device and to improve display performance.

For example, the disclosed display device may include a protection film thrilled over a base substrate. The protection film includes a first retardation film. A touch film is formed on the protection film. The touch film includes a second retardation film. A polarizer film is formed on the touch film. In one embodiment, the first and second retardation films, either alone or in combination, may provide desired quarter-wave. For example, each of the first and second retardation films may be a ⅛λ retardation film.

Figure 1:
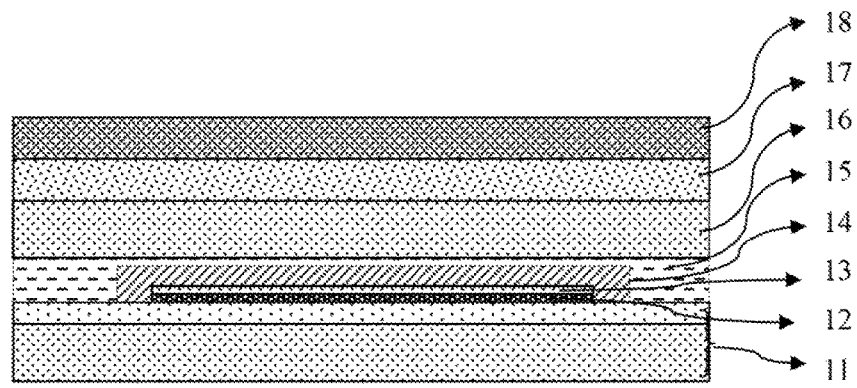
FIG. 1 illustrates a conventional flexible OLED display device.

FIG. 1 illustrates a conventional flexible OLED display device. As shown, the flexible OLED display device may include a base substrate 11. The base substrate 11 includes a polyimide (PI) film, and a barrier film on the PI film. A thin-film transistor (TFT) array 12 is on the base substrate 11. An OLED display unit 13 is disposed on the TFT array 12. A thin-film encapsulation (TFE) film 14 encapsulates the OLED display unit 13 and the TFT array 12.

To protect the display device and the encapsulation film 14 from physical damage and to facilitate subsequent bonding process with the polarizer and touch film, a barrier film 16 is stacked on the encapsulation film 14 via an adhesive layer 15. A circular polarizer 17 is stacked on the barrier film 16 via a pressure-sensitive adhesive (PSA). A touch film 18 is on the circular polarizer 17.

As disclosed, an exemplary display device, such as a flexible OLED display device, may include a protection film including a ⅛λ retardation film, and a touch film including ⅛λ retardation film on the protection film.

Figure 2:
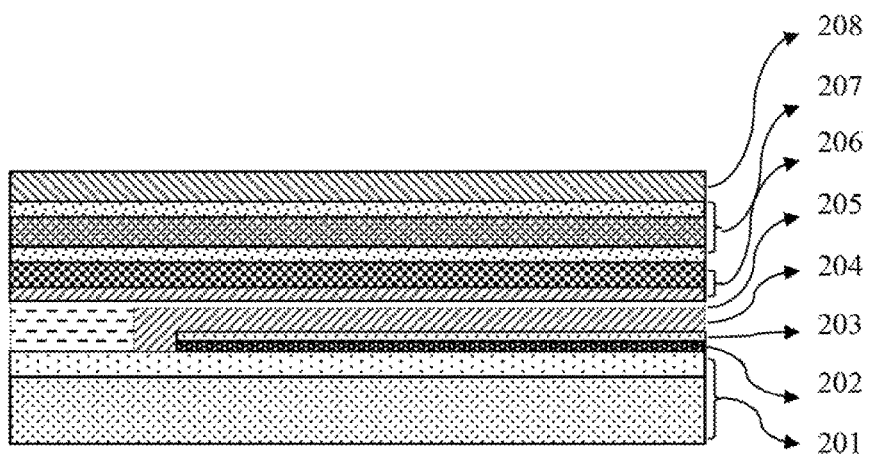
FIG. 2 illustrates an exemplary flexible OLED display device according to various disclosed embodiments.

FIG. 2 illustrates art exemplary flexible display device according to various disclosed embodiments.

As shown in FIG. 2, the exemplary flexible display device includes: a base substrate 201, a TFT array 202, a pixel array 203, an encapsulation film 204, an adhesive layer 205, a protection film 206 exemplary flexible display device a ⅛λ, retardation film, a touch film 207 exemplary flexible display device a ⅛λ retardation film, and a polarizer film 208.

Figure 3:
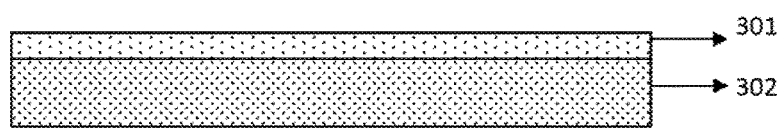
FIG. 3 illustrates an exemplary base substrate according to various disclosed embodiments.

In one embodiment, the base substrate 201 may be a flexible substrate. FIG. 3 shows an exemplary base substrate according to various disclosed embodiments.

The exemplary base substrate 201 may include a flexible substrate 301 and a barrier film 302 configured on the back of the flexible substrate 301. In other words, the flexible substrate 301 may be formed on the barrier film 302.

The flexible substrate 301 may be made of a flexible material, such as, for example, plastic, polyimide (PI), polyester, Mylar, and/or stainless steel foil. In some embodiments, the flexible substrate 301 may be optically transparent or have a desired optical transmittance. In one embodiment, the flexible substrate 301 includes a PI film.

The barrier film 302 may be aligned and bonded with the flexible substrate 301, e.g., by applying an optical clear adhesive (OCA) or a pressure sensitive adhesive (PSA) there-between, to prevent water, oxygen from entering the display device through the flexible substrate 301, without damaging components of the display device. In one embodiment, the flexible substrate 301 may have a thickness ranging from about 5 μm to about 20 μm. The barrier film 302 may have a thickness ranging from about 50 μm to about 100 μm.

Referring back to FIG. 2, the TFT array 202 may be formed on the base substrate 201 to provide driving circuit for the display device.

The pixel array 203 may be formed on the TFT array 202. The pixel array 203 may include a light-emitting structure for the display device. The pixel array 203 may be a top light-emitting OLED pixel array.

The encapsulation film 204 may be a TFE film used to encapsulate the TFT array 202 and the pixel array 203 on the base substrate 201.

For example, the encapsulation film 204 may include one or more elements or films selected from a group of an inorganic structure film, an inorganic-organic composite material thin film, an inorganic-organic thin-film stack, and a laminated structure of an inorganic-organic composite material thin film and an organic thin film.

Among them, the inorganic material involved in the encapsulation film 204 may be, for example, alumina, titania, zirconia, silicon oxide, silicon nitride, silicon carbonitride, etc. The organic material involved in the encapsulation film 204 may be, for example, poly (methyl methacrylate), hexamethyl silyl ether, or any suitable organic material(s). The inorganic-organic composite material may include, for example, a mixture of silica and long-chain silicon-carbon compound(s).

As disclosed herein, the inorganic material(s) contained in the encapsulation film 204 may facilitate to block water and oxygen. In addition, the organic material(s) contained in the encapsulation film 204 may facilitate to provide: surface planarization/flattening function, and particle coating function, and/or pin hole filling function. As such, use of the encapsulation film 204 may effectively protect the display device from being damaged by water and oxygen. In the meantime, use of the encapsulation film 204 may allow the formed display device thinner.

In one embodiment, the encapsulation film 204 may have a total thickness ranging from about 1 μm to about 20 μm.

Referring back to FIG. 2, the protection film 206 may be formed on the encapsulation film 204, for example, via the adhesive layer 205 configured there-between. The adhesive layer 205 may be an OCA layer or a PSA layer. The adhesive layer 205 may be bonded with the protection film 206 on one side and may be bonded with the encapsulation film 204 on an apposite side of the adhesive layer 205. The adhesive layer 205 may facilitate to planarize/flatten surfaces of the protection film 206 and the encapsulation film 204 and then bond them together.

Figure 4:
FIG. 4 illustrates an exemplary protection film according to various disclosed embodiments.

FIG. 4 illustrates air exe protection film 206 according to various disclosed embodiments.

As shown in FIG. 4, the exemplary protection film 206 includes a ⅛λ retardation film 401 and a water-oxygen-barrier layer 402. The ⅛λ retardation film 401 may be formed on the water-oxygen-harrier layer 402, or vice versa.

The water-oxygen-barrier layer 402 may be formed of alumina, titanic, zirconia, oxide nitride, silicon nitride, and/or silicon carbonitride. The ⅛λ retardation film 301 may be a polymer wave plate.

Referring back to FIG. 2, the touch film 207 may be formed on the protection film 206. For example, an adhesive layer (not illustrated) may be configured between the protection film 206 and the touch film 207. The adhesive layer may be an OCA layer or a PSA layer. The adhesive layer may be bonded with the protection film 206 on one side and may be bonded with the touch film 207 on an opposite side of the adhesive layer. The adhesive layer may facilitate to planarize/flatten surfaces of the protection film 206 and the touch film 207 at ad bond them together.

Figure 5:
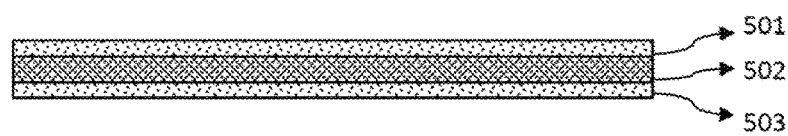
FIG. 5 illustrates an exemplary touch film according to various disclosed embodiments.

FIG. 5 illustrates an exemplary touch film 207 according to various disclosed embodiments. In one embodiment, the touch film 207 may be a glass-film-film (GFF) touch film.

The exemplary touch film 207 includes an X-conductive coating 501, a ⅛λ retardation film 502, and a Y-conductive coating 503. The ⅛λ retardation film 502 can be sandwiched between the X-conductive coating 501 and Y-conductive coating 503. The X-conductive coating 501 can be an X-electrode of the touch film. The Y-conductive coating 503 can be a Y-electrode of the touch film.

As shown in FIG. 5, the ⅛λ retardation film 502 in the touch film 207 along with the ⅛λ retardation film 401 in the protection film 206 can be added up and equal to a ¼λ retardation film. The ⅛λ retardation film 401/502 may be a polymer wave plate. Such touch film is used as a touch input device to provide fast response, to save space, and to be easy for human-computer communication.

Referring back to FIG. 2, the polarizer film 208 is located above the touch film 207. The polarizer film 208 may be made of a polymer, such as polyvinyl alcohol (PVA).

For example, an adhesive layer (not illustrated) may be configured between the touch film 207 and the polarizer film 208. The adhesive layer may be an OCA layer or a PSA layer. The adhesive layer may be bonded with the polarizer film 208 on one side and may be bonded with the touch film 207 on an opposite side of the adhesive layer. The adhesive layer may facilitate to planarize/flatten surfaces of the touch film 207 and the polarizer film 208 and then bonded them together.

In one embodiment, for the device shown in FIG. 2, ambient light may first pass through the polarizer film 208 and may become linearly polarized light, which then passes through the ⅛λ retardation film in the touch film 207 and the ⅛λ retardation film in the protection film 206 to become circularly polarized light. The circularly polarized light may then be reflected to re-enter and pass through the ⅛λ retardation film in the protection film 206 and the ⅛λ retardation film in the touch film 207 to become linearly polarized light. The linearly polarized light may be perpendicular to a direction of the transmission axis of the polarizer film 208. The linearly polarized light may be blocked within the polarizer, thus eliminating effect of ambient light on the emitted light from the OLE) device.

As such, the ⅛λ retardation film in the touch film 207, the ⅛λ retardation film in the protection film 206, and the polarizer film 208 together may be used to realize a circular polarizer. By using the disclosed protection film 206 containing the ⅛λ retardation film, instead of using conventional harrier film 16 without any retardation film, and by replacing PET film in a convention GFF touch film with the disclosed ⅛λ retardation film in the disclosed touch film 207, fabrication cost and a total thickness of the display device may be reduced.

For example, the conventional flexible OLED display device in FIG. 1 includes: the touch screen 18 that often requires a substrate with a thickness; the harrier film 16 that also requires a substrate with a thickness; and the circular polarizer 17 that includes a polarizer film and a ¼λ retardation film, in order to realize a circular polarizer. In contrast, as disclosed herein, each of the touch film 207 and the protection film 206 includes the ⅛λ retardation film to replace the respective substrate, and together with the polarizer film 208 to realize a circular polarizer. As such, the total thickness of the disclosed display device may be significantly reduced.

In addition, bending and folding properties of the flexible display devices may be increased and the flexible display device may be lighter and thinner.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:
1. A display device, comprising:
a thin film transistor array and an organic light emitting diode (OLED) pixel array on a base substrate;
an encapsulation film encapsulating the thin film transistor array and the OLED pixel array;
a protection film over the encapsulation film, the protection film including a first retardation film;
a touch film on the protection film, the touch film including a second retardation film; and
a polarizer film on the touch film,
wherein each of the first and second retardation films includes a ⅛λ retardation film.

2. The display device according to claim 1, wherein the touch film further includes an X-conductive coating and a Y-conductive coating, and the second retardation film is sandwiched between the X-conductive coating and Y-conductive coating.

3. The display device according to claim 2, wherein the X-conductive coating is an X-electrode of the touch film, and the Y-conductive coating is a Y-electrode of the touch film.

4. The display device according to claim 1, wherein the protection film further includes a water-oxygen-barrier layer laminated with the first retardation film.

5. The display device according to claim 4, wherein the water-oxygen-barrier layer is formed of one or more materials selected from a group of alumina, titania, zirconia, oxide nitride, silicon nitride, and silicon carbonitride.

6. The display device according to claim 1, wherein one or more of the first and second retardation films include a polymer wave plate.

7. The display device according to claim 1, wherein the encapsulation film includes one or more elements selected from a group of an inorganic structure film, an inorganic-organic composite material thin film, an inorganic-organic thin-film stack, and a laminated structure of an inorganic-organic composite material thin film and an organic thin film.

8. The display device according to claim 1, wherein the encapsulation film contains one or more inorganic materials selected from a group of alumina, titania, zirconia, silicon oxide, silicon nitride, and silicon carbonitride.

9. The display device according to claim 1, wherein the encapsulation film contains one or more organic materials selected from a group of poly (methyl methacrylate) and hexamethyl silyl ether.

10. The display device according to claim 1, wherein the encapsulation film contains an inorganic-organic composite material including a mixture of silica and a long-chain silicon-carbon compound.

11. The display device according to claim 1, wherein the encapsulation film has a thickness ranging from about 1 µm to about 20 µm.

12. The display device according to claim 1, wherein the polarizer film is made of a polymer including polyvinyl alcohol (PVA).

13. The display device according to claim 1, wherein the base substrate includes a flexible substrate on a barrier film.

14. The display device according to claim 13, wherein the flexible substrate has a thickness ranging from about 5 µm to about 20 µm, and the barrier film has a thickness ranging from about 50 µm to about 100 µm.

15. The display device of claim 1, wherein each of the first and second retardation films has a fixed retardation value of $\frac{1}{8}\lambda$.

16. The display device according to claim 1, wherein:
a total retardation of the display device is $\frac{1}{4}\lambda$; and
the first and second retardation films are separated from each other by a non-retardation layer of the display device.

17. A method for forming a display device, comprising:
forming a thin film transistor array and an organic light emitting diode (OLED) pixel array over a base substrate;
forming an encapsulation film encapsulating the thin film transistor array and the OLED pixel array;
providing a protection film over the encapsulation film, the protection film including a first retardation film;
forming a touch film on the protection film, the touch film including a second retardation film; and
forming a polarizer film on the touch film,
wherein each of the first and second retardation films includes a $\frac{1}{8}\lambda$ retardation film.

18. The method according to claim 17, wherein the touch film further includes an X-conductive coating and a Y-conductive coating, and the second retardation film is sandwiched between the X-conductive coating and Y-conductive coating.

19. The method according to claim 17, wherein the protection film further includes a water-oxygen-barrier layer laminated with the first retardation film.

* * * * *